(12) United States Patent
Wenxu et al.

(10) Patent No.: US 10,815,569 B2
(45) Date of Patent: Oct. 27, 2020

(54) SHOWER HEAD OF COMBINATORIAL SPATIAL ATOMIC LAYER DEPOSITION APPARATUS

(71) Applicant: Samsung Electronics Co., Ltd., Suwon-si, Gyeonggi-do (KR)

(72) Inventors: Xianyu Wenxu, Suwon-si (KR); Yongsung Kim, Suwon-si (KR); Jaikwang Shin, Seoul (KR); Wooyoung Yang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 882 days.

(21) Appl. No.: 15/014,568

(22) Filed: Feb. 3, 2016

(65) Prior Publication Data

US 2017/0058402 A1    Mar. 2, 2017

(30) Foreign Application Priority Data

Aug. 28, 2015  (KR) .................. 10-2015-0121830

(51) Int. Cl.
  *C23C 16/455*  (2006.01)
  *C23C 16/44*  (2006.01)
  *C40B 60/00*  (2006.01)

(52) U.S. Cl.
  CPC .... *C23C 16/45565* (2013.01); *C23C 16/4412* (2013.01); *C23C 16/45525* (2013.01);
  (Continued)

(58) Field of Classification Search
  CPC .... C03C 17/002; C30B 25/14; H01J 37/3244; H01L 21/205; H01L 21/228;
  (Continued)

(56) References Cited

U.S. PATENT DOCUMENTS

| 4,058,430 A | 11/1977 | Suntola et al. |
| 4,413,022 A | 11/1983 | Suntola et al. |

(Continued)

FOREIGN PATENT DOCUMENTS

| JP | 2005-320590 A | 11/2005 |
| KR | 10-1165615 B1 | 7/2012 |

(Continued)

OTHER PUBLICATIONS

P. Poodt et al. "Spatial Atomic Layer Deposition: A Route Towards Further Industrialization of Atomic Layer Deposition." Journal of Vacuum Science and Technology. A: Vacuum, Surfaces, and Films, 30(1), 010802-1/11. [010802]. DOI: 10.1116/1.3670745. (Year: 2012).*

(Continued)

*Primary Examiner* — Jeffrie R Lund
*Assistant Examiner* — Stanislav Antolin
(74) *Attorney, Agent, or Firm* — Harness, Dickey & Pierce, P.L.C.

(57) ABSTRACT

A shower head of a combinatorial spatial atomic layer deposition (CS-ALD) apparatus may be provided. The shower head of the CS-ALD apparatus may include a plurality of shower blocks. Each of shower blocks may include a plurality of unit modules. Each of the shower blocks and each of the unit modules may be controlled independently from each other. Each of the plurality of unit modules may include a source gas injection nozzle, a purge gas injection nozzle, a reactant gas injection nozzle, and exhaust areas between the injection nozzles. The plurality of shower blocks may be separated from each other. Gas injection areas of the injection nozzles may be separated from the exhaust area.

13 Claims, 7 Drawing Sheets

(52) U.S. Cl.
CPC .. *C23C 16/45544* (2013.01); *C23C 16/45548* (2013.01); *C40B 60/00* (2013.01)

(58) Field of Classification Search
CPC . H01L 21/3141; C23C 16/44; C23C 16/4401; C23C 16/4412; C23C 16/4481–4483; C23C 16/452; C23C 16/455; C23C 16/45514; C23C 16/45517; C23C 16/45519; C23C 16/45523–4555; C23C 16/45527; C23C 16/45536; C23C 16/45542; C23C 16/45544; C23C 16/45551; C23C 16/45561; C23C 16/45563; C23C 16/45565; C23C 16/45574; C23C 16/45578; C23C 16/45582; C23C 16/52; C23C 16/54; C23C 16/545

See application file for complete search history.

(56) References Cited

U.S. PATENT DOCUMENTS

| | | | | |
|---|---|---|---|---|
| 5,071,670 A * | 12/1991 | Kelly | C23C 16/27 | 118/319 |
| 5,863,337 A * | 1/1999 | Neuman | C03C 17/002 | 118/718 |
| 6,022,414 A * | 2/2000 | Miller | C03C 17/002 | 118/718 |
| 6,045,671 A * | 4/2000 | Wu | C04B 35/01 | 118/504 |
| 6,550,990 B2 * | 4/2003 | Sakurai | G03D 5/003 | 118/52 |
| 6,902,620 B1 * | 6/2005 | Omstead | C23C 16/45551 | 117/102 |
| 7,544,574 B2 * | 6/2009 | Chiang | B82Y 30/00 | 438/297 |
| 7,824,935 B2 * | 11/2010 | Verma | H01L 22/34 | 257/E21.008 |
| 7,902,063 B2 * | 3/2011 | Chiang | B82Y 30/00 | 257/E21.584 |
| 7,947,531 B1 * | 5/2011 | Chiang | H01L 22/20 | 118/723 R |
| 8,082,045 B1 * | 12/2011 | Ashizawa | G05B 19/41865 | 700/121 |
| 8,168,546 B2 | 5/2012 | Levy | | |
| 8,334,015 B2 * | 12/2012 | Chiang | C23C 16/45544 | 117/102 |
| 8,440,259 B2 * | 5/2013 | Chiang | C23C 16/45544 | 118/720 |
| 2001/0004881 A1 * | 6/2001 | Miller | C03C 17/002 | 118/729 |
| 2002/0164275 A1 * | 11/2002 | Wheeler | B01J 19/0046 | 422/130 |
| 2002/0172631 A1 * | 11/2002 | Chandler, Jr. | B01J 19/0046 | 422/130 |
| 2003/0037729 A1 * | 2/2003 | deDontney | C23C 16/4412 | 118/715 |
| 2003/0134089 A1 * | 7/2003 | Schultz | B01J 19/0046 | 428/173 |
| 2004/0026374 A1 * | 2/2004 | Nguyen | H01L 21/67173 | 216/89 |
| 2004/0069329 A1 * | 4/2004 | de Larios | B08B 3/04 | 134/95.2 |
| 2004/0099213 A1 * | 5/2004 | Adomaitis | C23C 16/4412 | 118/715 |
| 2004/0106072 A1 * | 6/2004 | Itoh | G03F 7/30 | 430/329 |
| 2004/0187784 A1 * | 9/2004 | Sferlazzo | C23C 16/45508 | 118/719 |
| 2004/0247787 A1 * | 12/2004 | Mackie | C23C 16/40 | 427/248.1 |
| 2005/0016457 A1 * | 1/2005 | Kawasaki | C23C 16/452 | 118/723 E |
| 2005/0087767 A1 * | 4/2005 | Fitzgerald | B01J 19/0093 | 257/200 |
| 2005/0103265 A1 * | 5/2005 | Gianoulakis | C23C 16/4412 | 118/715 |
| 2005/0214452 A1 * | 9/2005 | Forrest | G02B 6/262 | 427/162 |
| 2006/0118414 A1 * | 6/2006 | Goto | C23C 14/3492 | 204/298.26 |
| 2006/0292845 A1 * | 12/2006 | Chiang | H01L 21/32051 | 438/597 |
| 2007/0082508 A1 * | 4/2007 | Chiang | C23C 16/46 | 438/800 |
| 2007/0089857 A1 * | 4/2007 | Chiang | B01J 19/0046 | 165/80.2 |
| 2007/0199510 A1 * | 8/2007 | Weiner | H01L 21/67126 | 118/719 |
| 2007/0202610 A1 * | 8/2007 | Chiang | C23C 14/54 | 436/518 |
| 2007/0202614 A1 * | 8/2007 | Chiang | C23C 14/54 | 438/14 |
| 2007/0215036 A1 | 9/2007 | Park et al. | | |
| 2007/0224348 A1 * | 9/2007 | Dickey | C23C 16/45551 | 427/248.1 |
| 2007/0238311 A1 * | 10/2007 | Levy | C23C 16/403 | 438/765 |
| 2007/0267631 A1 * | 11/2007 | Weiner | H01L 21/67005 | 257/48 |
| 2008/0156769 A1 * | 7/2008 | Weiner | C23C 16/45514 | 216/59 |
| 2008/0166884 A1 * | 7/2008 | Nelson | C23C 16/45517 | 438/765 |
| 2008/0182358 A1 * | 7/2008 | Cowdery-Corvan | C23C 16/407 | 438/104 |
| 2009/0061083 A1 * | 3/2009 | Chiang | C23C 16/45544 | 427/248.1 |
| 2009/0061644 A1 * | 3/2009 | Chiang | C23C 16/45544 | 438/763 |
| 2009/0061646 A1 * | 3/2009 | Chiang | C23C 16/45544 | 438/763 |
| 2009/0068849 A1 * | 3/2009 | Endo | C23C 16/4412 | 438/763 |
| 2009/0078204 A1 * | 3/2009 | Kerr | C23C 16/45551 | 118/728 |
| 2009/0081374 A1 * | 3/2009 | Yang | C23C 16/042 | 427/487 |
| 2009/0081827 A1 * | 3/2009 | Yang | C23C 16/042 | 438/104 |
| 2009/0081842 A1 * | 3/2009 | Nelson | C23C 16/407 | 438/289 |
| 2009/0081883 A1 * | 3/2009 | Freeman | C23C 16/30 | 438/765 |
| 2009/0081885 A1 * | 3/2009 | Levy | C23C 16/45519 | 438/778 |
| 2009/0081886 A1 * | 3/2009 | Levy | C23C 16/45551 | 438/790 |
| 2009/0117272 A1 * | 5/2009 | Behres | C23C 16/301 | 427/255.5 |
| 2009/0205570 A1 * | 8/2009 | Kang | C23C 16/44 | 118/715 |
| 2009/0217878 A1 * | 9/2009 | Levy | C23C 16/45551 | 118/729 |
| 2009/0226604 A1 * | 9/2009 | Ohmi | C23C 14/12 | 427/66 |
| 2009/0291209 A1 | 11/2009 | Granneman et al. | | |
| 2009/0291211 A1 * | 11/2009 | Ryu | C23C 16/45551 | 427/255.23 |
| 2009/0304924 A1 * | 12/2009 | Gadgil | C23C 16/4412 | 427/255.5 |
| 2010/0037820 A1 * | 2/2010 | Lee | C23C 16/45551 | 118/719 |
| 2010/0163404 A1 * | 7/2010 | De | C23C 14/042 | 204/192.12 |
| 2010/0242837 A1 | 9/2010 | Goto et al. | | |
| 2010/0326358 A1 * | 12/2010 | Choi | C23C 16/45546 | 118/725 |

(56) References Cited

U.S. PATENT DOCUMENTS

| | | | |
|---|---|---|---|
| 2011/0023775 A1* | 2/2011 | Nunes | C23C 16/45551 118/58 |
| 2011/0081486 A1* | 4/2011 | McCamy et al. | C23C 16/4401 427/255.19 |
| 2011/0086167 A1* | 4/2011 | Nunes | C23C 16/4412 427/249.17 |
| 2011/0239940 A1* | 10/2011 | Benvenuti | C23C 16/45565 118/715 |
| 2011/0264252 A1* | 10/2011 | Ashizawa | H01L 22/20 700/97 |
| 2012/0003396 A1 | 1/2012 | Maas et al. | |
| 2012/0090545 A1* | 4/2012 | Chiang | C23C 16/45544 118/719 |
| 2012/0125258 A1* | 5/2012 | Lee | C23C 16/45536 118/719 |
| 2012/0141676 A1* | 6/2012 | Sershen | C23C 16/45551 427/255.23 |
| 2012/0189766 A1* | 7/2012 | Rajala | C03C 17/002 427/8 |
| 2012/0196050 A1* | 8/2012 | Vermeer | C23C 16/45551 427/535 |
| 2012/0207948 A1 | 8/2012 | Lee | |
| 2012/0225193 A1* | 9/2012 | Yudovsky | C23C 16/45551 427/58 |
| 2012/0225207 A1* | 9/2012 | Yudovsky | C23C 16/45551 427/255.5 |
| 2012/0225219 A1* | 9/2012 | Yudovsky | C23C 16/45551 427/595 |
| 2012/0244644 A1* | 9/2012 | Wang | H01L 51/0031 438/5 |
| 2012/0248219 A1* | 10/2012 | Yoon | C23C 16/45551 239/290 |
| 2012/0269967 A1* | 10/2012 | Yudovsky | C23C 16/452 427/255.26 |
| 2012/0301616 A1* | 11/2012 | Endo | C23C 16/45565 427/255.7 |
| 2012/0321786 A1* | 12/2012 | Satitpunwaycha | C23C 16/45565 427/252 |
| 2013/0005057 A1* | 1/2013 | Kim | C23C 16/4412 438/26 |
| 2013/0043212 A1 | 2/2013 | De Graaf et al. | |
| 2013/0047921 A1* | 2/2013 | Tornqvist | C23C 16/4412 118/715 |
| 2013/0125818 A1* | 5/2013 | Wright | B82Y 30/00 257/E21.584 |
| 2013/0130490 A1* | 5/2013 | Lee | H01L 22/34 257/E21.008 |
| 2013/0133580 A1* | 5/2013 | Wright | C23C 16/4412 118/725 |
| 2013/0136862 A1* | 5/2013 | Satitpunwaycha | C23C 16/00 427/255.7 |
| 2013/0137267 A1* | 5/2013 | Chang | H01J 37/3244 438/694 |
| 2013/0143415 A1* | 6/2013 | Yudovsky | C23C 16/45551 438/765 |
| 2013/0145587 A1* | 6/2013 | Adhiprakasha | H01L 21/6708 29/25.01 |
| 2013/0145989 A1* | 6/2013 | Satitpunwaycha | C23C 16/45565 118/724 |
| 2013/0149201 A1* | 6/2013 | van Berkel | B08B 3/024 422/129 |
| 2013/0150230 A1* | 6/2013 | Taylor | B82Y 30/00 502/1 |
| 2013/0160858 A1* | 6/2013 | Francis | H01L 21/67057 137/1 |
| 2013/0164458 A1* | 6/2013 | Soininen | C23C 16/45544 427/569 |
| 2013/0171350 A1* | 7/2013 | Kraus | C23C 16/45551 239/290 |
| 2013/0171805 A1* | 7/2013 | Kraus | H01L 21/02436 438/478 |
| 2013/0192761 A1* | 8/2013 | Yudovsky | C23C 16/54 156/345.55 |
| 2013/0196078 A1* | 8/2013 | Yudovsky | C23C 16/4584 427/535 |
| 2013/0210238 A1* | 8/2013 | Yudovsky | H01L 21/02104 438/758 |
| 2013/0266728 A1* | 10/2013 | Seo | C23C 16/45551 427/255.28 |
| 2013/0316472 A1* | 11/2013 | Joshi | C23C 16/45544 427/248.1 |
| 2013/0323422 A1* | 12/2013 | Peidous | G05B 19/41865 700/121 |
| 2014/0008763 A1* | 1/2014 | Mujumdar | C23C 16/45544 118/720 |
| 2014/0087490 A1* | 3/2014 | Kahlon | H01L 21/6719 438/14 |
| 2014/0110764 A1* | 4/2014 | Niyogi | C23C 16/45544 438/763 |
| 2014/0120257 A1* | 5/2014 | Ripley | H01L 22/20 700/97 |
| 2014/0120723 A1* | 5/2014 | Fu | H01L 21/28506 438/680 |
| 2014/0147350 A1* | 5/2014 | Foster | B01J 19/0046 422/600 |
| 2014/0147587 A1* | 5/2014 | Endo | C23C 16/4412 438/763 |
| 2014/0154859 A1* | 6/2014 | Gopal | C23C 16/45544 117/102 |
| 2014/0174540 A1* | 6/2014 | Cheng | H01L 21/0228 438/758 |
| 2014/0262028 A1* | 9/2014 | Kelekar | H01L 21/67051 156/345.15 |
| 2014/0272112 A1* | 9/2014 | van Duren | H01L 21/67051 427/58 |
| 2014/0273309 A1* | 9/2014 | Niyogi | H01L 21/67051 438/16 |
| 2014/0273314 A1* | 9/2014 | Hashim | H01L 21/67051 438/17 |
| 2014/0273497 A1* | 9/2014 | Payne | H01L 21/67051 438/745 |
| 2015/0004318 A1* | 1/2015 | Alasaarela | C23C 16/4584 427/535 |
| 2015/0140696 A1* | 5/2015 | Ahmed | C23C 16/45544 438/763 |
| 2015/0147889 A1* | 5/2015 | Yudovsky | H01L 21/0228 438/758 |
| 2015/0179487 A1* | 6/2015 | Chen | C23C 16/45551 427/255.23 |
| 2015/0184287 A1* | 7/2015 | Tsung | C23C 16/45544 118/719 |
| 2015/0236566 A1* | 8/2015 | Yudovsky | H02K 7/14 156/345.51 |
| 2015/0252477 A1* | 9/2015 | Nguyen | C23C 16/4412 427/255.5 |
| 2015/0368798 A1* | 12/2015 | Kwong | C23C 16/45551 427/535 |
| 2015/0376782 A1* | 12/2015 | Griffin | C23C 16/4584 118/712 |

FOREIGN PATENT DOCUMENTS

| | | | | |
|---|---|---|---|---|
| KR | 10-1265905 B1 | | 5/2013 | |
| KR | 2013-0125478 A | | 11/2013 | |
| WO | WO-0048725 A1 | * | 8/2000 | B01J 19/0046 |
| WO | WO-2013121102 A2 | * | 8/2013 | C23C 16/45544 |
| WO | WO-2014127363 A1 | * | 8/2014 | C23C 16/45544 |

OTHER PUBLICATIONS

Patents and Patent Publications referenced in "P. Poodt et al. . . . Journal of Vacuum Science and Technology. A: Vacuum, Surfaces, and Films, 30(1), 010802-1/11" above. (Year: 2012).*

(56) References Cited

OTHER PUBLICATIONS

Levy et al. "Oxide electronics by spatial atomic layer disposition." *Journal of Display Technology*, vol. 5(12). Dec. 2009.
Poodt et al. "High-speed spatial atomic-layer deposition of aluminum oxide layers for solar cell passivation." *Advanced Materials*, 22. 2010.

\* cited by examiner

SHOWER HEAD OF COMBINATORIAL SPATIAL ATOMIC LAYER DEPOSITION APPARATUS

CROSS-REFERENCE TO RELATED APPLICATION

This application claims under 35 U.S.C. § 119 priority to Korean Patent Application No. 10-2015-0121830, filed on Aug. 28, 2015, in the Korean Intellectual Property Office, the disclosure of which is incorporated herein in its entirety by reference.

BACKGROUND

1. Field

The present disclosure relates to apparatuses for a deposition/etching apparatus for semiconductors or displays, and more particularly, to a shower head of a combinatorial spatial atomic layer deposition (CS-ALD) apparatus.

2. Description of the Related Art

As the degree of integration of semiconductor devices increases, three-dimensional structures of the semiconductor devices are becoming more complicated. Accordingly, an aspect ratio of the semiconductor devices increases.

As the structure of the semiconductor devices becomes complicated, deposition and etching processes for manufacturing a thin film become more challenging, and as a result, productivity and yield of these processes may decrease. An atomic layer deposition (ALD) method has been introduced as one solution to solve such challenges. By using the ALD method, depositing a thin film with a uniform thickness may be possible even in the case that a semiconductor device has a complicated structure. However, a deposition speed of the ALD method is relatively slow compared to other deposition methods. This deposition speed issue may be solved by using a spatial ALD method. When the spatial ALD method is used, a thin film with a uniform thickness may be deposited at a higher deposition speed for semiconductor devices with a complicated structure. Thus, according to the spatial ALD method, both productivity and yield of the spatial ALD method may increase.

SUMMARY

Some example embodiments provide shower head configurations and/or structures of a combinatorial spatial atomic layer deposition (CS-ALD) apparatus. The shower heads may determine optimum process conditions with relative ease by performing a single experiment (or a reduced set of experiments) including various combinations of thin film deposition processes and/or thin film etching processes at a desired location of a substrate, and replicate the determined deposition and/or etching process conditions to a larger or an entire area of the substrate. Further, the determined optimum conditions from a portion of the shower head may be measured and be easily transferrable for the mass production.

Additional aspects will be set forth in part in the description which follows and, in part, will be apparent from the description, or may be learned by practice of the presented example embodiments.

According to an example embodiment, a shower head of a CS-ALD apparatus may include a plurality of shower blocks. The plurality of shower blocks each may include a plurality of unit modules. Each of the shower blocks and each of the unit modules may be configured to be independently controlled. The plurality of unit modules each may include a first source gas injection nozzle, a first purge gas injection nozzle, a reactant gas injection nozzle, and at least one exhaust area between the injection nozzles.

In some example embodiments, the plurality of shower blocks may be separated from each other.

In some example embodiments, at least one gas injection area accommodating the injection nozzles may be separated from the at least one exhaust area.

In some example embodiments, the shower head may further include a first source gas supply line connected to the first source gas injection nozzle, a first purge gas supply line connected to the first purge gas injection nozzle, and automatic valves respectively provided at the first source gas supply line and the first purge gas supply line and controlled by a computer program.

In some example embodiments, the plurality of unit modules may be spaced apart from each other.

In some example embodiments, the first source gas injection nozzle may be surrounded by the at least one exhaust area.

In some example embodiments, the reactant gas injection nozzle may be surrounded by the at least one exhaust area.

In some example embodiments, the shower head may further include a second source gas injection nozzle and a second purge gas injection nozzle, which are provided between the first purge gas injection nozzle and the reactant gas injection nozzle.

In some example embodiments, the shower head may further include automatic valves respectively connected to the second source gas injection nozzle and the second purge gas injection nozzle.

In some example embodiments, the plurality of shower blocks may be arranged in a circular shape along a circumferential surface of a cylindrical drum.

In some example embodiments, a first exhaust passage connected to the at least one exhaust area adjacent to the first source gas injection nozzle may be separately provided from a second exhaust passage connected to the at least one exhaust area adjacent to the reactant gas injection nozzle.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
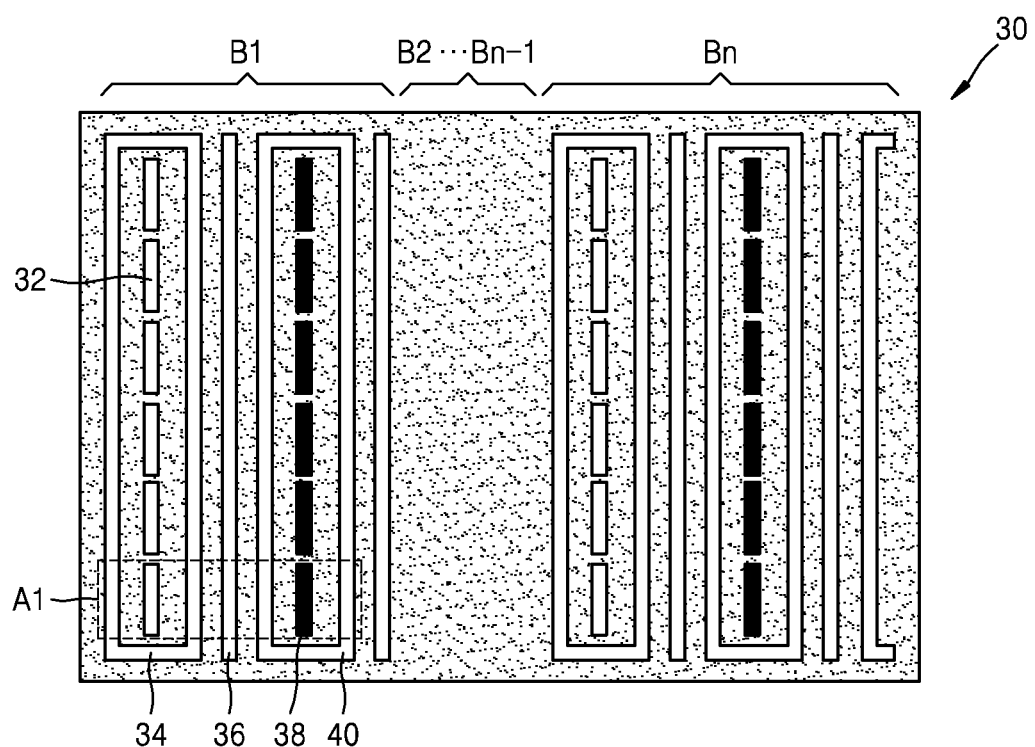
FIG. 1 is a bottom view of a shower head of a combinatorial spatial atomic layer deposition (CS-ALD) apparatus according to an example embodiment.

Reference will now be made in detail to various example embodiments, examples of which are illustrated in the accompanying drawings, wherein like reference numerals refer to like elements throughout. In this regard, the present example embodiments may have different forms and should not be construed as being limited to the descriptions set forth herein. Rather, these example embodiments are merely provided so that this disclosure will be thorough and complete, and will fully convey the scope of example embodiments to those skilled in the art. In the drawings, the sizes and relative sizes of the various layers and regions may have been exaggerated for clarity. As used herein, the term "and/or" includes any and all combinations of one or more of the associated listed items. Expressions such as "at least one of," when preceding a list of elements, modify the entire list of elements and do not modify the individual elements of the list.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Meanwhile, when it is possible to implement any embodiment in any other way, a function or an operation specified in a specific block may be performed differently from a flow specified in a flowchart. For example, two consecutive blocks may actually perform the function or the operation simultaneously, and the two blocks may perform the function or the operation conversely according to a related operation or function.

Hereinafter, some example embodiments will be explained in further detail with reference to the accompanying drawings.

Shower head structures of a combinatorial spatial atomic layer deposition (CS-ALD) apparatus according to some example embodiment will be described in detail below with reference to accompanying drawings.

FIG. 1 illustrates a bottom view of a shower head of a combinatorial spatial atomic layer deposition (CS-ALD) apparatus according to an example embodiment.

Referring to FIG. 1, a shower head 30 may include a plurality of shower blocks B1, B2 . . . Bn−1 and Bn, where "n" is a natural number greater than 2. Each of shower blocks B1, B2 . . . Bn−1 and Bn may include a plurality of source gas injection areas 32, a plurality of purge gas injection areas 36, a plurality of reactant gas injection areas 38, and a plurality of exhaust areas 34 and 40. Remaining gas at each operation of thin film deposition process or etching process and by-product gas generated during the thin film deposition process or the etching process may be exhausted to the outside of the apparatus through the plurality of exhaust areas 34 and 40. A first exhaust area 34 may surround the plurality of source gas injection areas 32. The first exhaust area 34 and the plurality of source gas injection areas 32 may be separated from each other. The plurality of reactant gas injection areas 38 may be surrounded by a second exhaust area 40. The plurality of reactant gas injection areas 38 and the second exhaust area 40 may be separated from each other. One of the purge gas injection areas 36 may be between the first exhaust area 34 and the second exhaust area 40. The plurality of purge gas injection areas 36 may be separated from the first and second exhaust areas 34 and 40. In each of blocks B1, B2 . . . Bn−1 and Bn, the plurality of source gas injection areas 32, the plurality of purge gas injection areas 36, the plurality of reactant gas injection areas 38 and the plurality of exhaust areas 34 and 40 may be arranged in parallel with each other. The first exhaust area 34 may be connected to an exhaust pump (not illustrated). Remaining source gas after use out of gas injected from the source gas injection area 32 may be exhausted through the first exhaust area 34. Purge gas injected onto a substrate from the purge gas injection area 36 may be exhausted, after use, through the first exhaust area 34. Source gas separated from the substrate by the injected purge gas (meaning source gas not completely attached onto the substrate), or source gas physically adsorbed onto the substrate may be exhausted through the first exhaust area 34. The second exhaust area 40 may be connected to an exhaust pump (not illustrated). Remaining reactant gas after use out of gas injected from the reactant gas injection area 38 may be exhausted through the second exhaust area 40. Purge gas injected onto the substrate from the purge gas injection area 36 may be exhausted, after use, through the second exhaust area 40. Reactant gas forced to be separated from the substrate by the injected purge gas (meaning reactant gas not completely attached onto the substrate), or reactant gas physically adsorbed onto the substrate may be exhausted through the second exhaust area 40. The exhaust pump connected to the first exhaust area 34 may be different from that connected to the second exhaust area 40. For example, an exhaust passage of gas exhausted through the first exhaust area 34 may be different from that through the second exhaust area 40. Thus, the exhausted gas through the first exhaust area 34 and the exhausted gas through the second exhaust area 40 may be prevented from meeting or reacting with each other in an exhaust process.

A reference numeral "A1" denotes a unit module installation area. The unit module described below may be installed in the unit module installation area A1. The unit module installation area A1 may include one of the source gas injection areas 32, one of the reactant gas injection areas 38 and the purge gas injection area 36 between the source gas injection area 32 and the reactant gas injection area 38. The unit module installation area A1 may further include the first exhaust area 34 adjacent to the one of the source gas injection areas 32 and the second exhaust area 40 adjacent to the one of the reactant gas injection areas 38. Each of blocks B1, B2 . . . Bn−1 and Bn may include a plurality of the unit module installation areas A1. In each of blocks B1, B2 . . . Bn−1 and Bn, the plurality of unit module installation areas A1 may form a matrix array. A configuration illustrated as the unit module installation area A1 refers to a case when a binary thin film is deposited. When the thin film to be deposited is a ternary or more thin film, the unit module installation area A1 may further include at least one of additional source gas injection area(s), additional exhaust area(s), and additional purge gas injection area(s). For example, when a ternary thin film is deposited (meaning, for example, that the thin film is deposited using two source gases and one reactant gas), the unit module installation area A1 may further include a second source gas injection area (not illustrated), a third exhaust area (not illustrated) surrounding the second source gas injection area, and a second purge gas injection area (not illustrated) between the purge gas injection area 36 and the second exhaust area 40.

Figure 2:
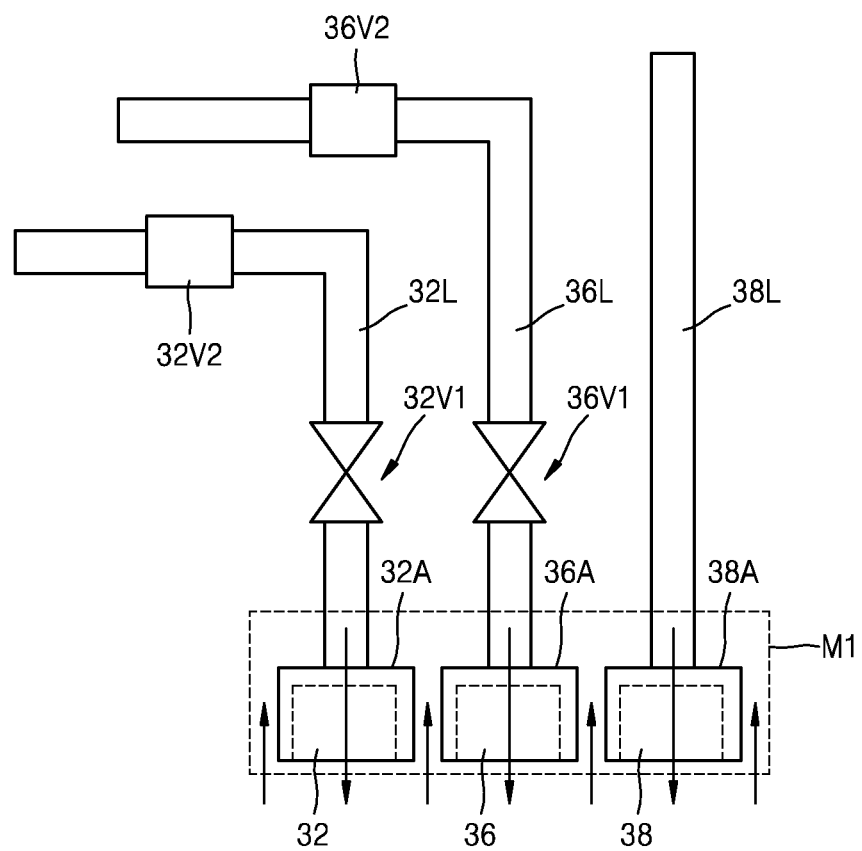
FIG. 2 is a cross-sectional view of a unit module installed in a unit module installation area A1 in FIG. 1.

FIG. 2 is a cross-sectional view of a unit module installed on the unit module installation area A1 in FIG. 1.

Referring to FIG. 2, a unit module M1 may include a source gas injection nozzle 32A, a purge gas injection nozzle 36A and a reactant gas injection nozzle 38A. The injection nozzles 32A, 36A and 38A may be separated from each other. Each of the injection nozzles 32A, 36A and 38A may have a gas jet structure. The exhaust areas 34 and 40 in FIG. 1 may be between the injection nozzles 32A, 36A and 38A. For example, the first exhaust area 34 in FIG. 1 may be between the source gas injection nozzle 32A and the purge gas injection nozzle 36A, and the second exhaust area 40 in FIG. 1 may be between the purge gas injection area 36A and the reactant gas injection nozzle 38A. The source gas injection nozzle 32A may be installed or inserted onto the source gas injection area 32 in the unit module installation area A1 in FIG. 1. The purge gas injection nozzle 36A may be installed or inserted onto the purge gas injection area 36 in the unit module installation area A1 in FIG. 1. The reactant gas injection nozzle 38A may be installed or inserted onto the reactant gas injection area 38 in the unit module installation area A1 in FIG. 1. In FIG. 2, a downward arrow denotes an injection of gas toward the substrate and an upward arrow denotes an exhaustion of gas through exhaust areas. A source gas supply line 32L may be connected to the source gas injection nozzle 32A. First and second valves 32V1 and 32V2 may be installed on the source gas supply line 32L. At least one of the first and second valves 32V1 and 32V2 may be an auto valve. The first and second valves 32V1 and 32V2 may be automatically controlled by using a computer program, in accordance with process conditions. The source gas supply line 32L may be connected to a source gas supply source that is outside the shower head. The source gas supply line 32L may be directly connected to the source gas supply source. According to an example embodiment, the source gas supply line 32L may be connected to the source gas supply source after being combined with other source gas supply lines corresponding to other unit modules. A purge gas supply line 36L may be connected to the purge gas injection nozzle 36A. A third and fourth valves 36V1 and 36V2 may be installed on the purge gas supply line 36L. At least one of the third and fourth valves 36V1 and 36V2 may be an auto valve controlled by a computer program. Thus, the third and fourth valves 36V1 and 36V2 may be automatically controlled by using the computer program, in accordance with process conditions. The purge gas supply line 36L may be connected to a purge gas supply source that is outside the shower head. The purge gas supply line 36L may be directly connected to the purge gas supply source, like the source gas supply line 32L. The purge gas supply line 36L may be connected to the purge gas supply source after being combined with other purge gas supply lines corresponding to other unit modules. An injection gas supply lines (e.g., source gas supply line 32L and purge gas supply line 36L) of each unit module may be connected to corresponding identical injection gas supply sources of the other unit modules. The injection gas supply lines of unit module each may be connected to injection gas supply sources which are different from each other. For example, purge gases supplied to unit modules may be different from each other. Purge gases supplied by some of the unit modules or per block may be different from purge gases supplied by some other of the unit modules. A reactant gas supply line 38L may be connected to the reactant gas injection nozzle 38A. Oxygen or plasma may be supplied to the substrate through the reactant gas supply line 38L. Plasma may be supplied in a line beam shape. This plasma may be plasma that is injected from a relatively long distance, for example, remote plasma. The supplied plasma may be an electron beam. When neutral oxygen is supplied through the reactant gas supply line 38L, a control valve may be installed on the reactant gas supply line 38L, like a case of the source gas supply line 32L or the purge gas supply line 36L. In FIG. 2, gas supply lines and valves may be included in a range of the unit module M1.

As described above, since valves 32V1, 32V2, 36 V1 and 36V2 installed on the source gas supply line 32L and the purge gas supply line 36L may be controlled by the computer program, in accordance with process conditions. the unit module M1 may control a thin film deposition process or an etching process, in accordance with process conditions. Because the plurality of unit modules may be installed onto each of blocks B1, B2 . . . Bn–1 and Bn in FIG. 1, each of blocks may be controlled by controlling each of unit modules, in accordance with process conditions. As a result, in the shower head, a determined area, a determined block or a determined unit module in the block may be controlled by a computer program. Therefore, optimum process conditions for a thin film deposition or etching process may be found or be determined in a relatively short time by simultaneously or concurrently performing thin film deposition or etching experiments with various process conditions through various combinations of unit modules or blocks. The thin film may be deposited onto a desired area or all area of the substrate by applying the determined optimum thin film deposition conditions to a particular area (e.g., some of unit modules or particular blocks of the shower head or to all blocks of the shower head). For example, the thin film may be etched on a desired area or all area of the substrate by applying the determined optimum etching conditions to a particular area or to all blocks of the shower head. Further, thin films different from each other may be simultaneously or concurrently deposited on areas different from each other on the substrate, by varying thin film deposition conditions by a unit module or some of unit modules or particular block(s) through a program control. The thin films deposited onto the areas different from each other on the substrate may have different compositions. The thin films deposited onto the areas different from each other may have the same compositions, while a ratio of major components of the thin films being different.

Figure 3:
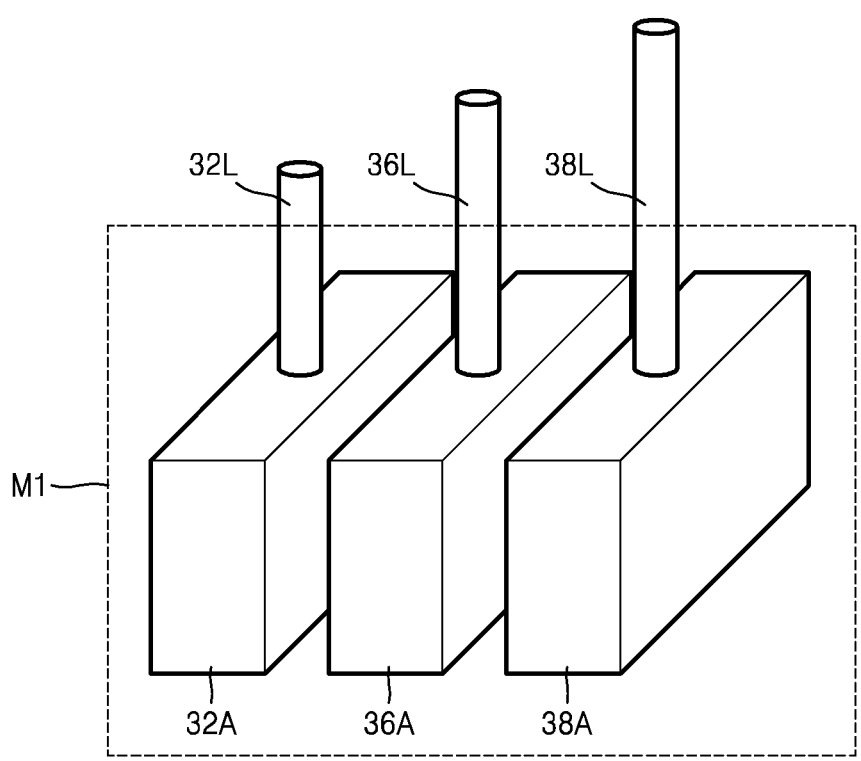
FIG. 3 is a three-dimensional view of the unit module of FIG. 2.

FIG. 3 is a three-dimensional view of the unit module of FIG. 2. For the sake of convenience, an illustration of valves installed on the gas supply lines 32L and 36L is omitted. The source gas injection nozzle 32A, the purge gas injection nozzle 36A and the reactant gas injection nozzle 38A may be installed on the source gas injection area 32, the purge gas injection area 36 and the reactant gas injection area 38 of the unit module installation area A1 in FIG. 1, respectively. The unit module installation area A1 in FIG. 1 may have a structure that facilitates installation and separation of each of the injection nozzles 32A, 36A and 38A. For example, old or defective injection nozzles may be easily replaced by new nozzles. Such replacement may be performed per shower block.

Figure 4:
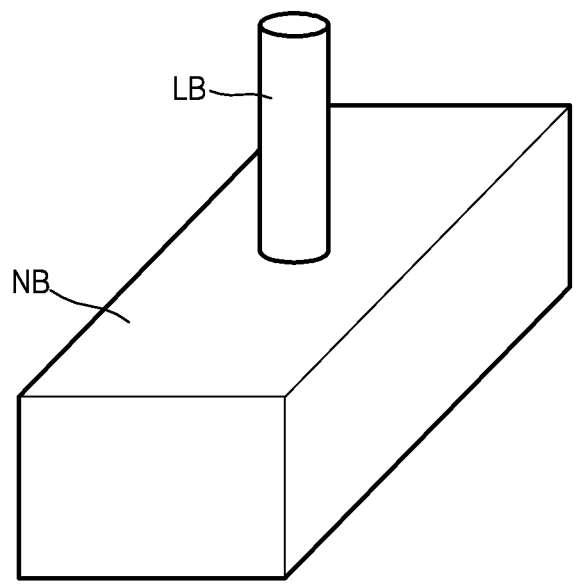
FIG. 4 is a simplified three-dimensional view of the unit module of FIG. 3.

Referring to FIG. 4, the unit module M1 illustrated in FIG. 3 is represented by one nozzle block NB and one supply line LB for the sake of convenience.

Figure 5:
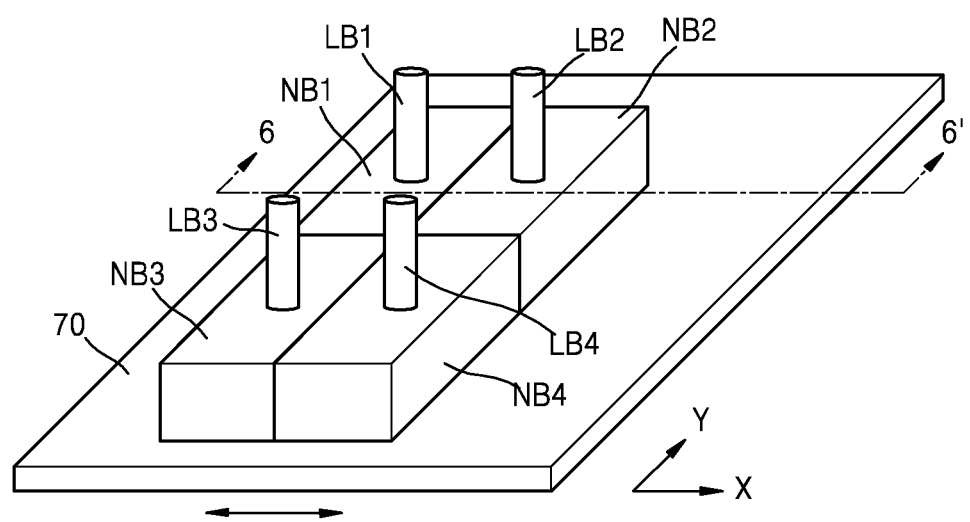
FIG. 5 is a three-dimensional view of a unit module array installed on a substrate.
Figure 6:
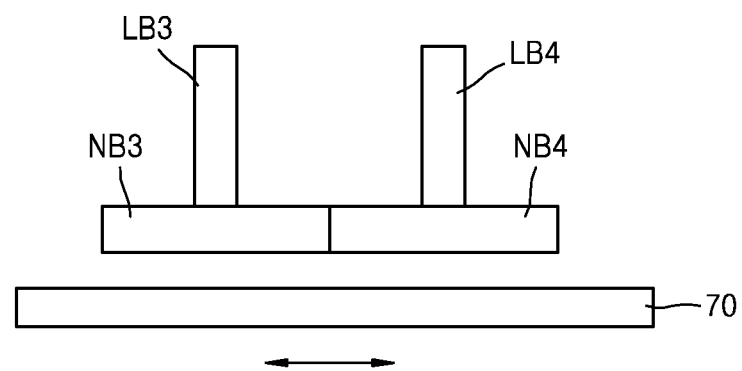
FIG. 6 is a cross-sectional view of FIG. 5, cut along a line 6-6'.

FIGS. 5 and 6 illustrate a unit module array installed onto a substrate. FIG. 5 is a three-dimensional view of a unit module array and FIG. 6 is a cross-sectional view of FIG. 5, cut along a line 6-6'.

Figure 7:
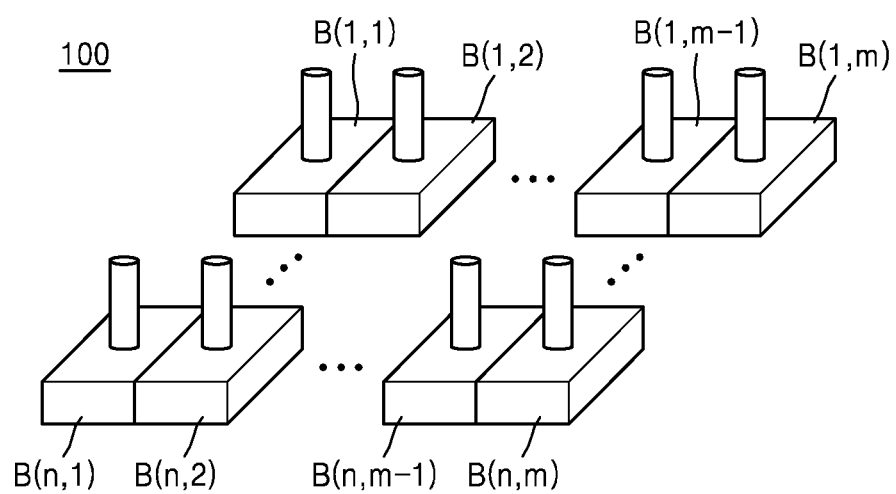
FIG. 7 is a three-dimensional view of a plurality of unit modules (e.g., each including a nozzle block), which are included in a shower block of a shower head according to an example embodiment.

Referring to FIGS. 5 and 6, four unit modules, that is, four nozzle blocks NB1-NB4 may form a 2 by 2 array. There may be a gap between such nozzle array and the substrate 70. For example, the nozzle array may be separated from the substrate 70 by a distance. This distance may be adjusted through a location adjustment of the shower head, or that of a support or a chuck on which the substrate 70 is to be mounted. The nozzle array may be fixed and the substrate 70 may move left or right along an x-axis direction. Thin film deposition conditions (e.g., gas supply rate and/or gas density) for a portion of nozzle blocks may be different from those for another portion of nozzle blocks. For example, the first and second nozzle blocks NB1 and NB2 may be controlled to have deposition conditions (e.g., gas supply rate and/or gas density) different from the third and fourth nozzle blocks NB3 and NB4. Thus, different thin films may be simultaneously or concurrently deposited on different areas of the substrate 70. In the event that the process is an etching process, thin films formed on different areas of the substrate 70 may be simultaneously or concurrently etched by differently controlling etching conditions, for example, with respect to respective portions of nozzle block. For example, the first and second nozzle blocks NB1 and NB2 may be controlled to have different etching conditions from the third and fourth nozzle blocks NB3 and NB4. In FIG. 5, the first and second nozzle blocks NB1 and NB2 and the third and fourth nozzle blocks NB3 and NB4 are illustrated as being adjoined together. However, the first to fourth nozzles NB1 to NB4 may be spaced apart from each other at a desired (or alternatively, predetermined) distance. Blocks B1, B2 . . . Bn–1 and Bn in FIG. 1 may be separated apart from each other at a desired (or alternatively, predetermined) distance. FIG. 7 illustrates a plurality of unit modules (e.g., each including a nozzle block) including a plurality of nozzle blocks.

Referring to FIG. 7, the plurality of nozzle blocks included in the shower block 100 may form an n by m array.

In FIG. 7, deposition conditions or etching conditions may be differently controlled, for example, by a row or by a column in the shower block 100. For example, all nozzle blocks B(1,1) . . . B(1,m) on a first row may operate with a first operation condition (e.g., a first gas supply rate). All of nozzle blocks B(n,1) . . . B(n,m), n=2, 3, 4 . . . , m=3, 4, 5 on a n-th row may operate with a n-th operation condition (e.g., a n-th gas supply rate). The first operation condition may be different from the n-th operation condition. Thin films having conditions different from each other may be formed on a plurality of areas of one substrate different from each other by operating the shower block 100 as described above. For example, the block 100 may not move and the substrate may perform a reciprocating motion in a straight line in a desired (or alternatively, predetermined) direction under the shower block 100. The motion may be repeated until a thickness of the thin film formed on the plurality of areas reaches a desired (or alternatively, predetermined) thickness.

Measurement of physical and/or chemical characteristics of thin films formed on the plurality of areas of the substrate may determine on which area a thin film closest to a desired thin film is formed. That is, an area on which a thin film closest to a desired thin film may be determined by measuring physical and/or chemical characteristics. The area where the thin film closest to the desired thin film is formed may correspond to a particular area of the shower block 100 (e.g., the first row with the first operation condition). Afterwards, operations of remaining nozzle blocks B(2,1)-B(n,m) of the block 100 may perform thin film deposition process using the first operation condition. In this manner, all nozzle blocks of the shower block 100 may be configured to form thin films each being closest to the desired thin film. In the case of etching, a desired etching or an optimum etching condition may be determined through an etching process with respect to all nozzle blocks B(1,1) . . . B(1,m) on the first row similar to the process of finding the thin film closest to the desired thin film. Thus, the shower block 100 may perform an optimum or desired etching by applying the determined etching condition to all nozzle blocks B(1,1)_B(n,m).

Figure 8:
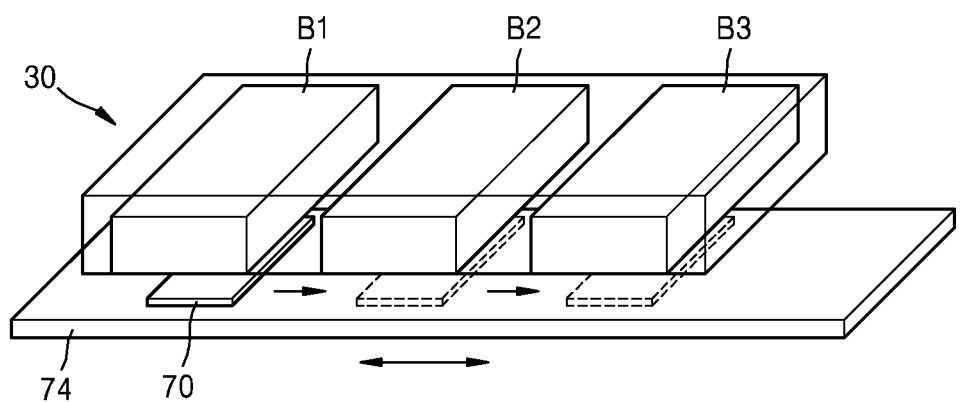
FIG. 8 is a three-dimensional view showing a case in which a thin film is deposited by a shower head including three shower blocks, according to an example embodiment.

FIG. 8 is a three-dimensional view illustrating a thin film deposition by a shower head including three blocks B1, B2 and B3. In FIG. 8, an illustration of gas supply lines is omitted for the sake of convenience.

Referring to FIG. 8, a first through third blocks B1-B3 included in a shower head 30 may be arranged in parallel with each other on a support 74 in a longitudinal direction of the support 74, and be separated from each other. An example of an arrangement of nozzle blocks (e.g., unit modules) included in each of the first through third blocks B1-B3 may be the same as that illustrated in FIG. 7. The first through third blocks B1-B3 may be operated with a first through third deposition conditions, respectively. The first through third deposition conditions may be identical to or different from each other.

After a substrate 70 is loaded on the support 74, a first thin film may be deposited onto the substrate 70 by using a first block B1. In the middle of a deposition process of the first thin film, the substrate 70 may be moved either left or right, and be positioned between the first block B1 and the second block B2. At the instant when the substrate 70 may be positioned between the first block B1 and the second block B2, characteristics (e.g., a thickness) of the formed thin film may be measured by using a measurement device (not illustrated). Such measurement may determine whether a desired thin film has been formed in a desired area of the substrate 70. Subsequently, the substrate 70 may be moved below the second block B2. Then, a second thin film may be deposited onto the substrate 70 by using the same method as that is used to form the first thin film. An area of the substrate 70 where the second thin film is to be deposited may be the same as or different from the area of the substrate 70 where the first thin film has been deposited. In the deposition process of the second thin film, the substrate 70 may be moved either left or right, and be positioned between the second block B2 and the third block B3 and characteristics of the second thin film may be measured using a measurement device (not illustrated). This measurement may determine whether the second thin film is formed with a desired thickness on the desired area of the substrate 70. If it is determined that the second thin film formed on the desired area does not have a desired thickness, at least a portion of a nozzle block included in the second block B2 may be adjusted so that the second thin film of a desired thickness may be deposited on the desired area of the substrate 70. When the second thin film is completely deposited onto the substrate 70, the substrate 70 may be moved and positioned under the third block B3 by moving the support 74. Next, a third thin film may be deposited on the substrate 70 by operating the third block B3 with a third deposition condition. An area of the substrate 70 on which the third thin film is deposited may be the same as or different from the areas on which the first and second thin films are deposited. In the middle of depositing the third thin film onto the substrate 70, the substrate 70 may be positioned between the second block B2 and the third block B3 to measure characteristics of the formed third thin film. This measurement may determine whether the third thin film has been deposited with the desired thickness on the desired area of the substrate 70. In this measurement, when the third thin film of a desired thickness is not formed on the desired area of the substrate 70, operations of nozzle blocks included in the third block B3 may be controlled so that the third thin film of a desired thickness may be deposited on the desired area of the substrate 70.

In the deposition process described above with regard to the first through third thin films using the first through third blocks B1-B3, the first through third thin films may not be deposited on all area of the substrate 70, but be locally deposited. That being said, not all of nozzle blocks included in the first through third blocks B1-B3 may be operated. For example, nozzle blocks corresponding to the local area of the substrate 70 may be selectively operated.

According to an example embodiment, alternatingly laminated thin films may be formed onto the substrate 70 by using some or all the first through third blocks B1-B3. For example, after the first thin film may be formed to have a desired (or alternatively, predetermined) thickness on the substrate 70 by using the first block B1 (a first operation), the second thin film may be deposited onto the first thin film by using the second block B2 (a second operation). According to an example embodiment, the first and second operations may be repeated for a desired (or alternatively, predetermined) number of times. Thus, a material layer in which the first and second thin films are alternatingly laminated may be formed onto the substrate 70.

Figure 9:
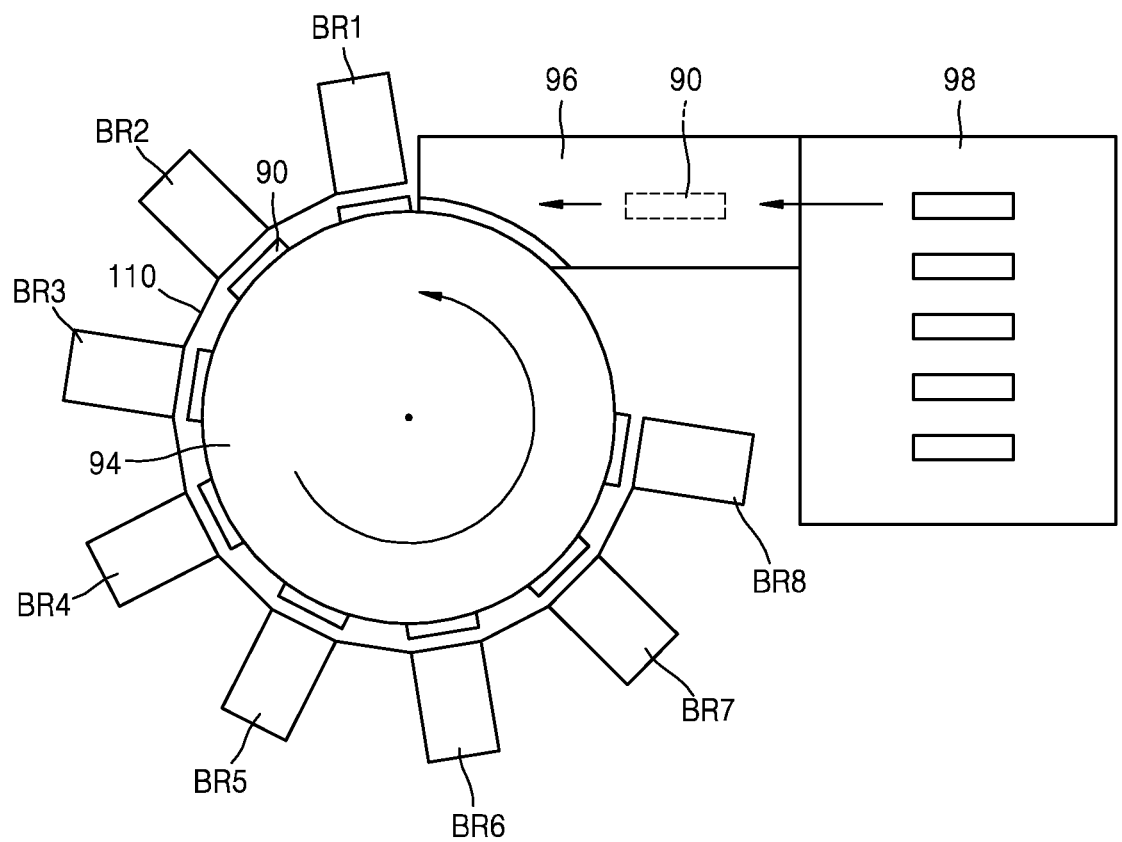
FIG. 9 is a cross-sectional view of a combinatorial spatial atomic layer deposition (CS-ALD) apparatus according to an example embodiment.

FIG. 9 is a cross-sectional view of a CS-ALD apparatus wherein a support configured to support a substrate is a cylindrical drum and a shower head is provided above and along a circumferential surface of the cylindrical drum.

Referring to FIG. 9, substrates 90 may be mounted on the circumferential surface of a cylindrical drum support 94. The substrates 90 may be a flexible substrate. The substrates 90 may be disposed along the circumferential surface of the support 94 and spaced apart from each other at a desired (or alternatively, predetermined) distance. The cylindrical drum support 94 may rotate in a given direction, for example, in a counterclockwise direction. A shower head including a plurality of blocks BR1-BR8 may be arranged along the circumferential surface of the cylindrical drum support 94. In FIG. 9, the number of the plurality of blocks BR1-BR8 included in the shower head is 8. However, the number of blocks included in the shower head may be smaller or more than 8. The plurality of blocks BR1-BR8 may be fixed by a supporting frame 110 along the circumferential surface of the support 94. The supporting frame 110 may surround at least a portion of the circumferential surface of the support 94. An arm chamber 96 may be provided close to a portion of the support 94 at which the supporting frame 110 is not provided. The substrate 90 may be loaded on the circumferential surface of the support 94 through the arm chamber 96. When the substrate 90 is loaded on the cylindrical drum support 94 or unloaded from the cylindrical drum support 94, the support 94 may not be rotated, and loading and unloading of the substrate 90 may be performed at a state when the arm chamber 96 becomes in contact with the support 94. After loading or unloading of the substrate 90 is completed, the arm chamber 96 may be separated from the support 94. The arm chamber 96 may be connected to a load lock chamber 98. Substrates to be loaded and unloaded substrates may be stored in the load lock chamber 98.

The substrate 90 mounted on the circumferential surface of the cylindrical drum support 94 may pass under the blocks BR1-BR8 so that various thin films can be deposited on the substrate 90. For example, a first material layer may be deposited on the substrate 90 by the first and second blocks BR1-BR2, and a second material layer may be deposited on the substrate 90 by the third through fifth blocks BR3-BR5. Further, a third material layer may be deposited on the substrate 90 by the sixth through eighth blocks BR6-BR8. The first material layer may be, for example, a positive electrode active material layer of a secondary battery such as lithium cobalt oxide (LCO). The second material layer may be, for example, an electrolyte layer of the secondary battery such as $Li_3PO_4$. The third material layer may be, for example, a negative electrode layer of the secondary battery. Organic/inorganic hybrid processes may be performed by using the CS-ALD apparatus of FIG. 9. For example, the CS-ALD apparatus may be used to deposit a flexible membrane for a flexible device. The flexible membrane may be a thin film encapsulation (TFE) membrane.

As described above, optimum process conditions for the organic/inorganic hybrid processes which have relatively complicated processes may be easily found or determined by controlling operation of the shower head per module and/or per block. Further, the shower head may be directly used for mass production by applying the found or determined process conditions to substantially entire portions of the shower head. Thus, the disclosed shower head may be directly applicable to the mass production of products by applying the found or the determined optimum process conditions to substantially entire portions of the shower head. When the disclosed shower head is utilized, experiment results from a portion of the shower head may be measured and be easily transferrable for the mass production.

Because the found optimum process conditions obtained by locally depositing or etching a thin film on a substrate using a portion of the shower head may be applicable to a thin film deposition process or a thin film etching process for an substantially entire area of the substrate, thin films may be uniformly deposited or etched over an entirety of the substrate.

Because various combinations of operations for the shower head may be possible, a screening for a suitable material, a development period for a multi-component material, and/or a development period for an organic/inorganic hybrid material may be shortened.

Because operations of the disclosed shower head may be applicable to both the deposition process and the etching process, both deposition and etching processes may be performed in a single apparatus.

Figure 10:
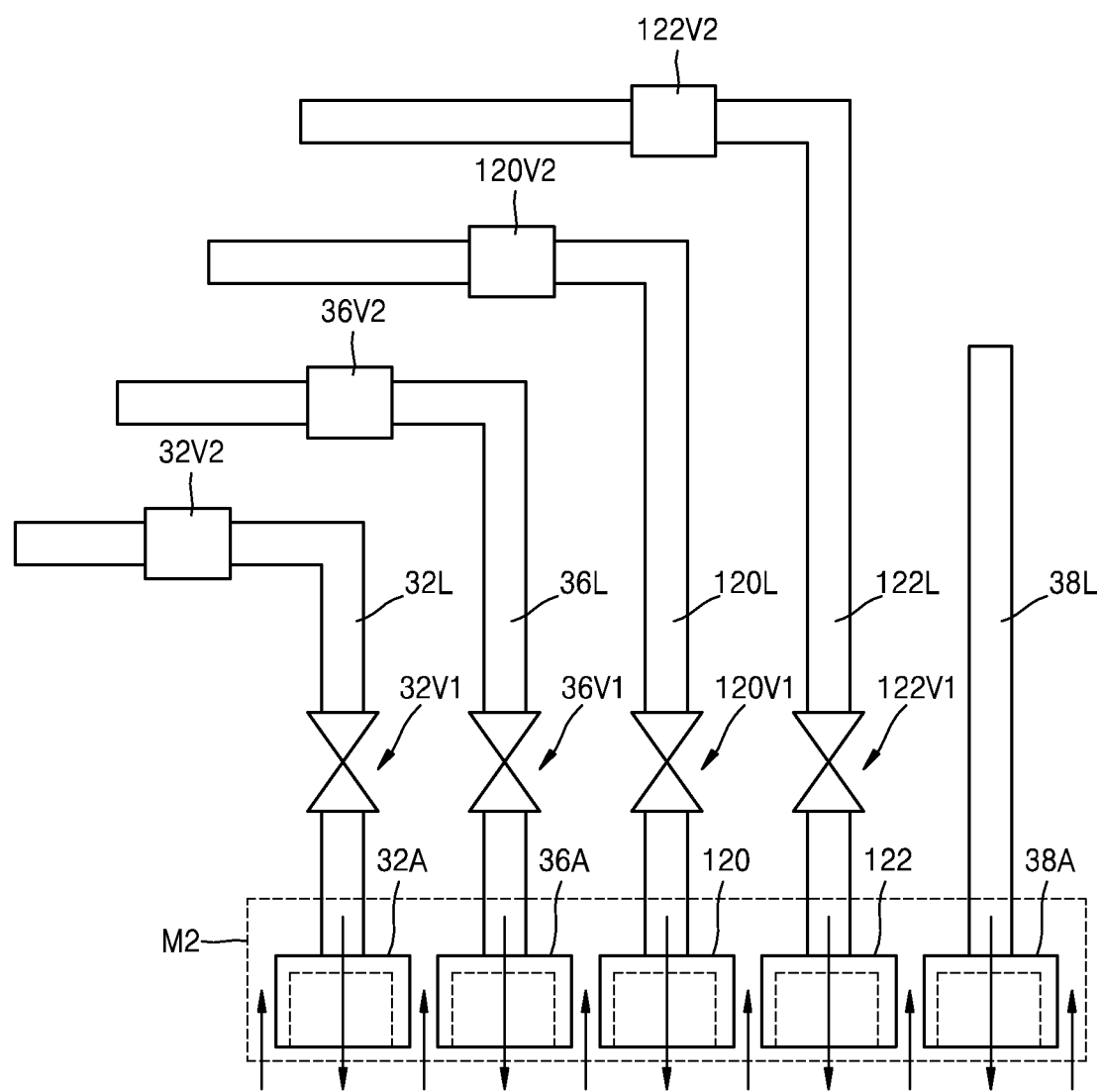
FIG. 10 is a cross-sectional view of a second unit module of the shower head for a ternary system thin film deposition.

The unit module M1 illustrated in FIG. 2 is to deposit a binary thin film. When a thin film to be deposited is a ternary or more thin film, at least one gas injection nozzle may be further included in the unit module illustrated in FIG. 2. FIG. 10 illustrates an example of such a case.

FIG. 10 is a cross-sectional view of a second unit module of a shower head for depositing a ternary thin film. Only portions different from the unit module of FIG. 2 will be described.

Referring to FIG. 10, a second unit module M2 may include the (first) source gas injection nozzle 32A, the (first) purge gas injection nozzle 36A, a second source gas injection nozzle 120, a second purge gas injection nozzle 122 and the reactant gas injection nozzle 38A, and one or more exhaust areas may be between these nozzles. A first source gas may be injected through the first source gas injection nozzle 32A, and a second source gas may be injected through the second source gas injection nozzle 120. Gas exhausted through a first exhaust area placed at both sides of the first source gas injection nozzle 32A, gas exhausted through a second exhaust area placed at both sides of the second source gas injection nozzle 120, and gas exhausted through a third exhaust area placed at both sides of the reactant gas injection nozzle 38A may be exhausted through exhaust passages different from (or separately provided from) each other. Because the exhausted gases may not meet each other in an exhaust process, a formation of a powder due to a reaction between exhaust gases may be prevented. A purge gas injected through the first purge gas injection nozzle 36A and the purge gas injected through the second purge gas injection nozzle 122 may be identical to or different from each other. A second source gas supply line 120L may be connected to the second source gas injection nozzle 120. A fifth valve 120V1 and a sixth valve 120V2 may be installed on the second source gas supply line 120L. At least one of the fifth valve 120V1 and the sixth valve 120V2 may be the auto valve controllable from the outside. A seventh valve 122V1 and an eighth valve 122V2 may be installed on the second purge gas injection nozzle 122. At least one of the seventh and eighth valves 122V1 and 122V2 may be the auto valve controllable from the outside. The nozzle block or the unit module included in blocks BR1-BR8 illustrated in FIG. 9 may be the unit module illustrated in FIG. 10. Thus, material layers, which compose the secondary battery, such as LCO, lithium phosphorous oxynitride (LiPON), electrodes and TFE may be deposited by using the shower head including the unit module illustrated in FIG. 1. Other multi-component material layers may be deposited or etched by using the shower head including the unit module illustrated in FIG. 10. Further, development period for multi-component materials or organic/inorganic hybrid materials may be shortened by using the shower head illustrated in FIG. 10. Still further, because operation of the shower head in FIG. 10 may be applicable to both the thin film deposition process and the thin film etching process like other shower heads described before, both deposition and etching processes of the thin film may be performed in the single apparatus.

It should be understood that some example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A shower head comprising:
a plurality of shower blocks, the plurality of shower blocks each comprising a plurality of unit modules, each of the shower blocks and each of the unit modules configured to be independently controlled, the plurality of unit modules each including,
a plurality of injection nozzles including,
   a first source gas injection nozzle configured to supply a first source gas,
   a first purge gas injection nozzle configured to supply a first purge gas,
   a reactant gas injection nozzle configured to supply a reactant gas, and
at least one exhaust area between the injection nozzles and configured to exhaust remaining portions of the first source gas, the first purge gas, and the reactant gas after use,
wherein the at least one exhaust area includes a first exhaust area between the first source gas injection nozzle and the first purge gas injection nozzle, and a second exhaust area between the reactant gas injection nozzle and the first purge gas injection nozzle,
each of the shower blocks comprises a plurality of source gas injection areas, and
the plurality of source gas injection areas are arranged in a line and are surrounded by the first exhaust area having a circumferential slot of a closed shape.

2. The shower head of claim 1, wherein the plurality of shower blocks are separated from each other.

3. The shower head of claim 1, wherein at least one gas injection area accommodating the injection nozzles is separated from the at least one exhaust area.

4. The shower head of claim 1, further comprising:
a first source gas supply line connected to the first source gas injection nozzle;
a first purge gas supply line connected to the first purge gas injection nozzle; and
automatic valves respectively provided at the first source gas supply line and the first purge gas supply line and controlled by a computer program.

5. The shower head of claim 1, wherein the plurality of unit modules are spaced apart from each other.

6. The shower head of claim 1, wherein the first source gas injection nozzle is surrounded by the at least one exhaust area.

7. The shower head of claim 1, wherein the reactant gas injection nozzle is surrounded by the at least one exhaust area.

8. The shower head of claim 1, further comprising:
a second source gas injection nozzle and a second purge gas injection nozzle between the first purge gas injection nozzle and the reactant gas injection nozzle.

9. The shower head of claim 8, further comprising:
automatic valves respectively connected to the second source gas injection nozzle and the second purge gas injection nozzle.

10. The shower head of claim 1, wherein the plurality of shower blocks are arranged in a circular shape along a circumferential surface of a cylindrical drum.

11. The shower head of claim 1, wherein a first exhaust passage connected to the at least one exhaust area adjacent to the first source gas injection nozzle is separately provided from a second exhaust passage connected to the at least one exhaust area adjacent to the reactant gas injection nozzle.

12. The shower head of claim 1, wherein the first purge gas injection nozzle is between the first source gas injection nozzle and the reactant gas injection nozzle in a direction perpendicular to an extension direction of the first source gas injection nozzle and the reactant gas injection nozzle.

13. The shower head of claim 1, wherein each of the shower blocks comprises a plurality of reactant gas injection areas, and the plurality of reactant gas injection areas are surrounded by the second exhaust area.

* * * * *